(12) United States Patent
Parker

(10) Patent No.: US 9,736,098 B2
(45) Date of Patent: Aug. 15, 2017

(54) EMAIL-BASED SOFTWARE DELIVERY

(71) Applicant: LENOVO (Singapore) PTE, LTD., New Tech Park (SG)

(72) Inventor: Joseph Robert Parker, Hillsborough, NC (US)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 226 days.

(21) Appl. No.: 14/175,382

(22) Filed: Feb. 7, 2014

(65) Prior Publication Data

US 2015/0229593 A1    Aug. 13, 2015

(51) Int. Cl.
| | |
|---|---|
| G06F 15/16 | (2006.01) |
| H04L 12/58 | (2006.01) |
| H04L 29/06 | (2006.01) |
| G06F 9/445 | (2006.01) |
| H03M 7/00 | (2006.01) |

(52) U.S. Cl.
CPC .............. H04L 51/08 (2013.01); G06F 8/60 (2013.01); H03M 7/00 (2013.01); H04L 67/42 (2013.01)

(58) Field of Classification Search
CPC . G06F 8/65; H04L 51/08; H04L 51/18; H04L 67/42
See application file for complete search history.

(56) References Cited

U.S. PATENT DOCUMENTS

| | | | | |
|---|---|---|---|---|
| 6,044,395 | A * | 3/2000 | Costales | G06Q 10/107 379/93.24 |
| 7,096,038 | B1 * | 8/2006 | Perrella | H04N 1/2179 348/207.1 |
| 2003/0084434 | A1 * | 5/2003 | Ren | G06F 8/65 717/172 |
| 2009/0067416 | A1 * | 3/2009 | Tavares | H04L 1/1607 370/355 |
| 2009/0271779 | A1 * | 10/2009 | Clark | G06F 17/30174 717/171 |
| 2010/0274856 | A1 * | 10/2010 | Bhadriraju | G06Q 10/107 709/206 |
| 2011/0125853 | A1 * | 5/2011 | Weber | H04L 12/584 709/206 |
| 2011/0252359 | A1 * | 10/2011 | England | G06F 9/4443 715/781 |
| 2013/0226979 | A1 * | 8/2013 | Caruso | H04L 65/605 707/827 |
| 2014/0214984 | A1 * | 7/2014 | Lee | H04L 51/063 709/206 |
| 2015/0200894 | A1 * | 7/2015 | Gough | G06Q 30/0273 715/752 |
| 2015/0235301 | A1 * | 8/2015 | Brady | G06Q 30/0635 705/26.81 |

* cited by examiner

*Primary Examiner* — Aftab N. Khan
(74) *Attorney, Agent, or Firm* — Kunzler Law Group

(57) ABSTRACT

A method, apparatus, and program product are disclosed for dividing, by a processor, a code segment into one or more portions that together form the code segment, generating a plurality of email messages, combining one or more portions of the code segment into an email message of the plurality of email messages, and sending the plurality of email messages to a client to be reassembled on the client.

18 Claims, 6 Drawing Sheets

EMAIL-BASED SOFTWARE DELIVERY

BACKGROUND

Field

The subject matter disclosed herein relates to software and more particularly relates to delivering software using email.

Description of the Related Art

In general, software may be downloaded from a server by a client over a data network. The downloaded software may include software programs and updates, such as feature updates, security updates, patches, etc. However, downloading software programs and updates over a data network can be ineffective in situations where a client does not have a consistent connection to a data network. In some circumstances, a client may be required to restart an interrupted download if the connection to the network is lost, which may be inefficient and frustrating.

BRIEF SUMMARY

An apparatus for email-based software delivery is disclosed. A method and computer program product also perform the functions of the apparatus. In one embodiment, an apparatus provides a server that includes a processor, which communicates with a client. An apparatus may also include a partition module that divides, by the processor, a code segment into one or more portions that together form the code segment. In another embodiment, an apparatus includes an email module that generates a plurality of email messages and combines one or more portions of the code segment into an email message of the plurality of email messages. In a further embodiment, an apparatus includes a communication module that sends the plurality of email messages to the client to be reassembled on the client.

In certain embodiments, the apparatus includes an action module that confirms an action related to the code segment. In some embodiments, the action is selected from the group consisting of a reassembly on the client and an execution on the client. In another embodiment, the email module combines one or more portions of the code segment into an email message by attaching the one or more portions to the email message. An apparatus, in one embodiment, further includes a sequence module that determines an order to send the plurality of email messages to the client.

In certain embodiments, the communication module sends an email message of the plurality of email messages in response to receiving an acknowledgement email message from the client. In some embodiments, the acknowledgement email message confirms reception of a sent email message. In another embodiment, an email message of the plurality of email messages includes instructions for reassembling the one or more portions of the code segment.

In a further embodiment, the communication module pauses sending email messages of the plurality of email messages in response to communication with the client being interrupted. In another embodiment, the communication module continues sending email messages of the plurality of email messages in response to communication with the client being restored.

In one embodiment, an apparatus includes an integrity module that resends one or more email messages in response to receiving an integrity email from the client. In some embodiments, the integrity email indicates that one or more portions of the code segment lacks integrity. An apparatus, in one embodiment, includes a security module that encrypts each email message of the plurality of email messages. An apparatus, in a further embodiment, includes a status module that determines the status of one or more code segments sent to a client. In certain embodiments, the status of the one or more code segments is presented to a user. In one embodiment, the code segment includes either a software update, a patch, or a software application.

In one embodiment, a method includes dividing, by a processor, a code segment into one or more portions that together form the code segment. A method, in another embodiment, includes generating a plurality of email messages and combining one or more portions of the code segment into an email message of the plurality of email messages. In certain embodiments, a method includes sending the plurality of email messages to a client to be reassembled on the client.

A method, in another embodiment, includes confirming an action related to the code segment wherein the action is selected from the group consisting of a reassembly on the client and an execution on the client. In one embodiment, combining one or more portions of the code segment into an email message comprises attaching the one or more portions to the email message. In some embodiments, a method includes determining an order to send the plurality of email messages to the client. A method, in a further embodiment, includes sending an email message of the plurality of email messages in response to receiving an acknowledgement email message from the client. In some embodiments, the acknowledgement email message confirms reception of a sent email message.

A method, in one embodiment, includes resending one or more email messages in response to receiving an integrity email from the client. In some embodiments, an integrity email indicates that one or more portions of the code segment lacks integrity. In another embodiment, a method includes encrypting each email message of the plurality of email messages. A method, in a further embodiment, includes determining the status of one or more code segments sent to a client. In one embodiment, the status of the one or more code segments is presented to a user.

A computer program product is provided that includes a computer readable storage medium that stores code executable by a processor to perform operations. In one embodiment, the operations include dividing a code segment into one or more portions that together form the code segment. In a further embodiment, the operations include generating a plurality of email messages and combining one or more portions of the code segment into an email message of the plurality of email messages. The operations, in another embodiment, include sending the plurality of email messages to a client to be reassembled on the client.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
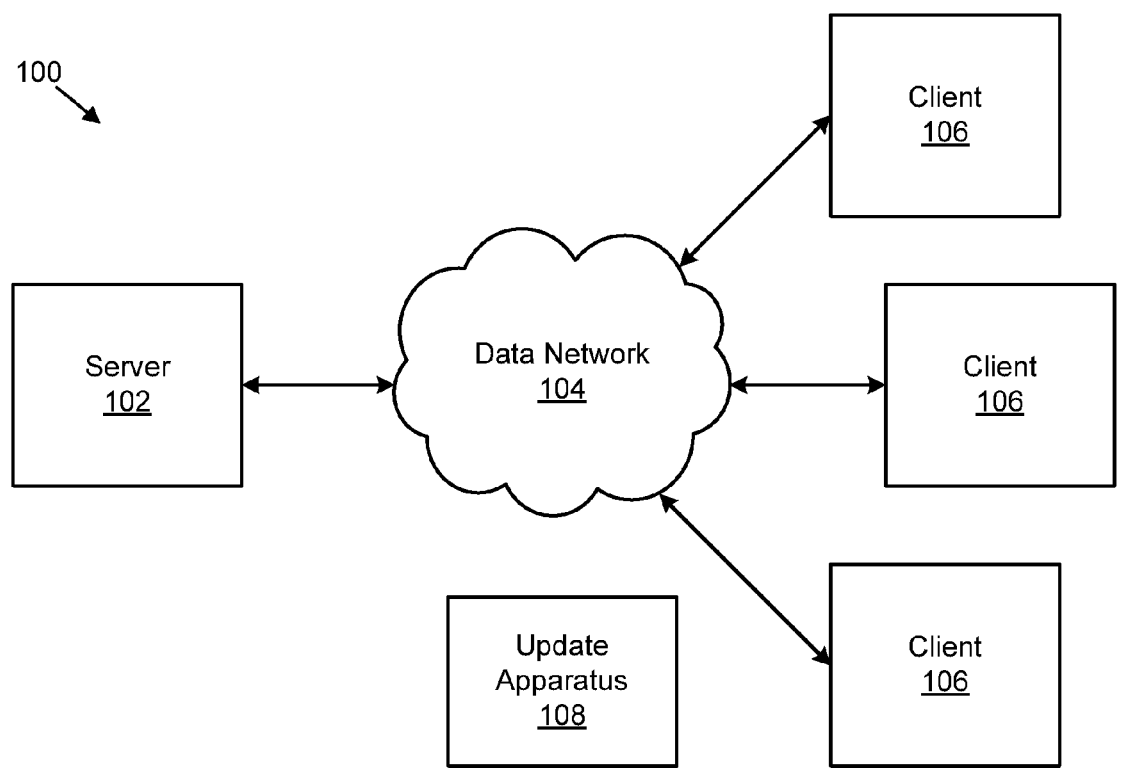
FIG. 1 is a schematic block diagram illustrating one embodiment of a system for email-based software delivery.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Java, Smalltalk, C++ or the like and conventional procedural programming languages, such as the "C" programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 depicts one embodiment of a system 100 for email-based software delivery. In one embodiment, the system 100 includes servers 102, data networks 104, clients 106, and update apparatuses 108, which are described below in more detail.

The servers 102, in certain embodiments, comprise a main frame computer, a desktop computer, a laptop computer, a cloud server, a smart phone, a tablet computer, and/or the like. In one embodiment, a server 102 is communicatively coupled to one or more clients 106 through the data network 104. In some embodiments, a server 102 is an email server configured to send and/or receive email message data. For example, an email server 102 may send email messages that include software data to the clients 106. In another embodiment, a server 102 executes an email server program, such as Exchange Server by Microsoft® of Redmond, Wash., or the like. An administrator, such as a network administrator, a database administrator, and/or the like, in certain embodiments, maintains and monitors the servers 102.

The data networks 104, in one embodiment, comprise a digital communication network 104 that transmits digital communications related to email-based software delivery. The digital communication network 104 may include a wireless network, such as a wireless telephone network, a local wireless network, such as a Wi-Fi network, a Bluetooth® network, and the like. The digital communication network 104 may include a wide area network ("WAN"), a storage area network ("SAN"), a local area network ("LAN"), an optical fiber network, the internet, or other digital communication network known in the art. The digital communication network 104 may include two or more networks. The digital communication network 104 may include one or more servers, routers, switches, and/or other networking equipment. The digital communication network 104 may also include computer readable storage media, such as a hard disk drive, an optical drive, non-volatile memory, random access memory ("RAM"), or the like.

The clients 106, in certain embodiments, include one or more information handling devices. In one embodiment, the clients 106 include a desktop computer, a server, a main frame computer, a smart TV, and/or the like. In some embodiments, the clients 106 include mobile devices, such as a tablet computer, a smart phone, a PDA, an eBook reader, a smart watch, a head-mounted optical display, and/or the like.

In certain embodiments, the clients 106 are in communication with a server 102 and sends/receives data to/from the server 102 through the data network 104. In some embodiments, the clients 106 receive email messages from the server 102 and send email messages to the server 102. In one embodiment, the clients 106 run an email client program, such as Outlook® by Microsoft® of Redmond, Wash., or the like, which may communicate with an email server running on the server 102. In another embodiment, the clients 106 access a web-based email client, such as Gmail® by Google® of Mountain View, Calif., or the like.

In some embodiments, the update apparatus 108 is configured to divide a code segment into one or more portions, combine the one or more portions into a plurality of generated email messages, and send the plurality of email messages to a client 106 such that the one or more portions may be reassembled and executed on the client 106. In one embodiment, portions of the update apparatus 108 are located on a server 102 and a client 106. The update apparatus 108, in another embodiment, includes one or more modules that perform the operations of the apparatus 108.

The update apparatus 108, and its accompanying modules, are described in more detail below.

Figure 2:
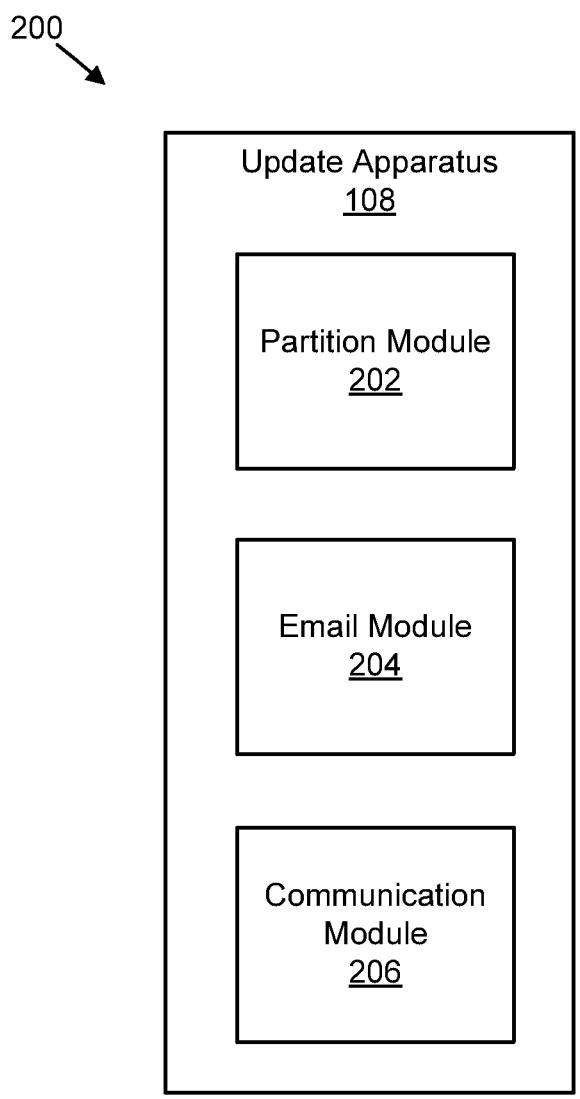
FIG. 2 is a schematic block diagram illustrating one embodiment of an apparatus for email-based software delivery.

FIG. 2 depicts one embodiment of an apparatus 200 for email-based software delivery. In one embodiment, the apparatus 200 includes an update apparatus 108. The update apparatus 108, in some embodiments, includes a partition module 202, an email module 204, and a communication module 206, which are described below in more detail.

In one embodiment, the partition module 202 divides a code segment into one or more portions that together form the code segment. In some embodiments, the code segment includes a software update, such as a patch, a service pack, a security update, a feature update, a bug fix, and/or the like. In another embodiment, the code segment includes a software installation package configured to install a new software application on a client 106. In certain embodiments, the partition module 202 divides the code segment on the server 102, which subsequently sends the one or more portions to clients 106.

In some embodiments, the partition module 202 reassembles the one or more portions to reconstitute the code segment. In further embodiments, the partition module 202 reassembles the one or more portions on a client 106 in response to the client 106 receiving all the portions of the divided code segment. The partition module 202, in some embodiments, divides the code segment into equal-sized portions. In another embodiment, the partition module 202 divides the code segment into one or more portions that each have a different size.

In a further embodiment, the partition module 202 divides the code segment into portions based on user input. For example, an IT administrator may specify the size of the portions of the code segment. In this manner, the IT administrator can tailor the portion sizes based on various factors, such as the constraints of the email server, the network connectivity history of a client 106, and/or the like.

In another embodiment, the email module 204 generates a plurality of email messages and combines the one or more portions of the code segment into each email message of the plurality of email messages. In one embodiment, the email module 204 attaches each portion of the code segment as an attachment to an email message. In another example, the email module 204 combines the one or more portions into an archived file, such as .zip, .tar, and/or the like, and attached to an email message. In another embodiment, the email module 204 provides one or more portions in the body of an email message.

In some embodiments, the email module 204 provides secondary data associated with an email message, such as a message, a subject, and/or the like. The secondary data may include data that is used by a client 106 receiving an email message to reassemble the one or more portions. For example, the email module 204 may insert instructions for reassembling the one or more portions within the body of the last email message of the plurality of email messages. Similarly, in another example, the email module 204 may provide descriptive data to the client 106 in the subject line and/or the body of an email message, such as the total number of portions to be received, the size of an attached portion, the total size of the reassembled code segment, error-detection codes, and/or the like.

In a further embodiment, the communication module 206 sends the plurality of email messages to a client 106, where the one or more received portions are subsequently reassembled. In certain embodiments, the communication module 206 initiates communication with a client 106 by sending an initiation email message. In some embodiments, the initiation email message comprises the first portion of the one or more portions of the code segment.

The communication module 206, in certain embodiments, does not send the next email message containing the next portion of the code segment until an acknowledgement email message is received from the client 106. The acknowledgement email message, in certain embodiments, confirms reception of an email message. Thus, in response to determining the client 106 successfully received an email message, and the portions combined in the message, the communication module 206 sends the next email message, including the next portions of the code segment.

In certain embodiments, the communication module 206 pauses sending email messages to a client 106 in response to communication with the client 106 being interrupted. For example, if a client 106 loses connection to the data network 104, such as by going outside the range of a Wi-Fi connection, the communication module 206 will pause sending emails to the client 106. The communication module 206, in one embodiment, continues sending email messages to the client 106 in response to communication with the client 106 being reestablished. In this manner, the client 106 may receive a complete code segment, such as a software update, when connection to the data network 104 is intermittent.

In one embodiment, the communication module 206 sends one or more email messages to a plurality of clients 106 on a distribution list. In one embodiment, a user, such as an IT administrator, creates a list of clients 106 that may receive a code segment. The IT administrator may determine which code segments to partition and assign the code segments to one or more clients 106 on the distribution list.

For example, an IT administrator in a corporation may create a distribution list of one or more clients 106 associated with sales persons who travel, i.e., "road warriors." The IT administrator may receive a status update of each client 106 associated with the "road warriors" to determine software updates that the clients 106 may need to receive. Because the "road warriors" travel, they may have intermittent connection to a data network 104, which may make it difficult to receive traditional software updates. Thus, the IT administrator may create a distribution list of clients 106 and assign a code segment (e.g., a software update) to each client 106, which may be partitioned and sent to the clients 106 via a plurality of email messages. In this manner, the "road warriors" may receive necessary software updates, patches, security updates, and/or the like, for their clients 106 even if a network 104 connection is intermittent.

In another embodiment, the email module 204 monitors reception of one or more email messages received from the communication module 206 on the client 106. For example, the email module 204 may monitor an email client running on the client 106 for emails sent from the server 102 that contains at least a portion of a code segment. In response to an email being received by the client 106, the email module 204 may receive the portion of the code segment combined in the received email message and store the portion on the client 106. In some embodiments, the email module 204 removes the email from the client's 106 inbox in response to receiving the portions attached to the received email.

In another embodiment, the email module 204 queues one or more received portions until a final email message is received by the client 106. In some embodiments, the final received email message includes instructions for reassembling the received portions. In response to a final email message being received, the one or more portions may be reassembled on the client 106 by the partition module 202. In some embodiments, the integrity of each of the received portions may be verified during reassembly by the integrity module 306. In another embodiment, the integrity of the reassembled code segment is verified by the integrity module 306. The reassembled code segment may then be executed by the client 106.

Figure 3:
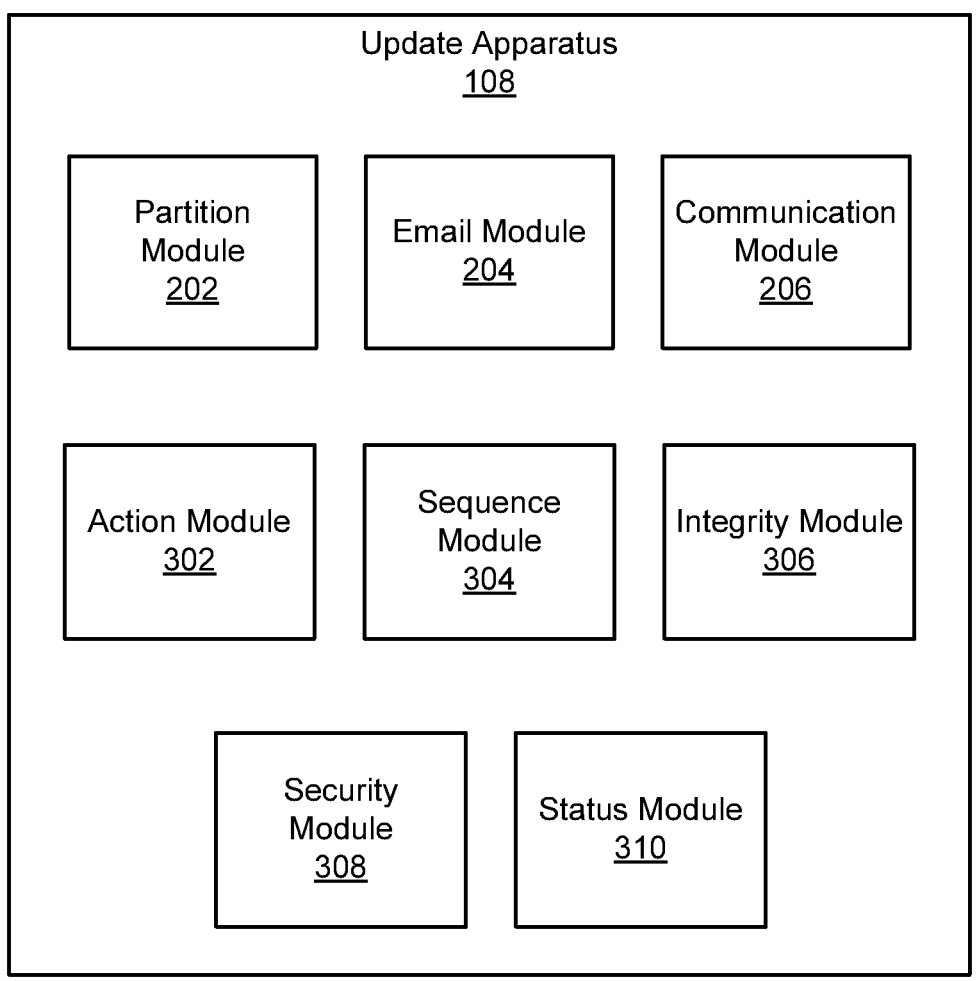
FIG. 3 is a schematic block diagram illustrating one embodiment of another apparatus for email-based software delivery.

FIG. 3 depicts another embodiment of an apparatus 300 for email-based software delivery. In one embodiment, the apparatus 300 includes an update apparatus 108. The update apparatus 108, in certain embodiments, includes a partition module 202, an email module 204, and a communication module 206, which are substantially similar to the partition module 202, email module 204, and communication module 206 described above with reference to FIG. 2. The update apparatus 108, in some embodiments, includes an action module 302, a sequence module 304, an integrity module 306, a security module 308, and a status module 310, which are described in more detail below.

The action module 302, in one embodiment, confirms an action related to the code segment. In certain embodiments, the action comprises reassembly on the client 106, execution on the client 106, and/or the like. In one embodiment, the action module 302 receives a confirmation email message from the client 106 in response to the client 106 reassembling the sent portions of the code segment. In another embodiment, the action module 302 receives a confirmation email message from the client 106 in response to the client 106 executing the reassembled code segment.

In some embodiments, the confirmation email message received by the action module 302 includes information describing the status of the reassembly of the code segment and/or the status of execution of the code segment. For example, the confirmation email message may include a message stating that the reassembly of the code segment was successful or unsuccessful. Similarly, the confirmation email message may include a message stating that the execution of the reassembled code segment was successful or unsuccessful. In some embodiments, as described below, the status module 310 presents the status of the reassembly of the code segment and/or the execution of the reassembled code segment to a user.

In another embodiment, the sequence module 304 determines an order to send the plurality of email messages to the client 106. In some embodiments, the sequence module 304 arranges the email messages in random order. In another embodiment, the sequence module 304 arranges the email messages in a reassembly order, which may include the same order necessary to reassemble the code segment. In certain embodiments, the sequence module 304 arranges the email messages in order of attachment size. For example, in embodiments where the size of the attached portions of the code segment vary, the sequence module 304 may send the email messages in ascending or descending order of size.

In another embodiment, the sequence module 304 determines the order to send the plurality of email messages based on user input. For example, an IT administrator may specify the order, on a per email basis, to send the email messages. In another example, the IT administrator may select an order scheme, such as random, ascending/descending based on size, reassembly order and/or the like.

The integrity module 306, in a further embodiment, resends one or more email messages in response to receiving an integrity email from the client 106. The integrity email, in certain embodiments, indicates that one or more portions of the code segment lacks integrity. In another embodiment, the integrity module 306 verifies an integrity of each portion of the code segment and/or the reassembled code segment. In some embodiments, the integrity module 306 is located on the server 102 and checks the integrity of the one or more portions being sent to the client 106 before they are sent to the client 106. In response to determining the corruption in a portion being sent, the integrity module 306, in one embodiment, notifies a user of the error. In another embodiment, the integrity module 306 notifies the partition module 202 of the corrupted portion, and the partition module 202 may repartition that portion of the code segment. In a further embodiment, the integrity module 306 notifies the email module 204 of the corrupted portion, which may recreate the email message associated with the corrupted portion of the code segment.

In another embodiment, the integrity module 306 is located on the client 106. In such an embodiment, the integrity module 306 verifies the integrity of a received email message, a received portion of the code segment, and/or the integrity of the reassembled code segment. In some embodiments, if the integrity module 306 determines that a portion of the code segment and/or the reassembled code segment is corrupt, the integrity module 306 resends one or more email messages comprising portions of the code segment. The integrity module 306 may also notify a user of the corrupted portions and/or the corrupted reassembled code segment, which may be presented to the user by the status module 310.

In one embodiment, the integrity module 306 verifies the integrity of the portions and/or the reassembled code segment by using an error-detection scheme. In one embodiment, the integrity module 306 uses a cyclic redundancy check ("CRC") to determine the integrity of the portions and/or reassembled code segment. In another embodiment, the integrity module 306 uses a checksum algorithm to create a checksum associated with each portion and/or reassembled code segment, which may be used to determine whether a portion and/or reassembled code segment has been corrupted. One of skill in the art will recognize other methods to verify the integrity of a block of code.

The security module 308, in another embodiment, encrypts each email message of the plurality of email messages on the server 102. In one embodiment, the security module 308 decrypts the plurality of email messages on the client 106. In certain embodiments, the security module 308 employs a public key/private key encryption scheme between the server 102 and client 106. For example, the security module 308 may encrypt an email message with a public encryption key and decrypt an encrypted email message with a private decryption key, e.g., a key only known to the client 106.

In another embodiment, the security module 308 employs a symmetric key encryption scheme between the server 102 and the client 106, where the encryption and decryption keys are the same. One of skill in the art will recognize other encryption methods that may be utilized to encrypt and decrypt emails. In certain embodiments, if the client 106 cannot decrypt an encrypted email message, or if there are other errors in the encryption/decryption process, the security module 308 notifies the user of the errors.

In one embodiment, the status module 310, determines the status of one or more code segments sent to a client 106. In some embodiments, the status module 310 tracks the progress of one or more portions of a code segment sent by the email module 204, and presents the status to a user. For example, the status module 310 may track how many email messages have been sent and how many emails are remaining to be sent. Alternatively, the status module 310 may report how many portions of the code segment have been sent and how many portions are remaining to be sent.

Further, the status module 310 monitors and/or reports whether a code segment has been successfully reassembled and/or executed on the client 106.

In another embodiment, the status module 310 presents to the user one or more notifications, such as error messages, informational messages, confirmation messages, and/or the like. For example, if a client 106 sends an error message that may require the user to take a certain action, the status module 310 may present the message to the user. In some embodiments, the status module 310 reports notifications and other information to a user through email, text message, desktop notifications, and/or the like. Alternatively, the status module 310 may present progress data, notifications, and/or the like in a graphical dashboard display, which provides an interface for a user to control and monitor the distribution of code segments and email messages.

In some embodiments, the dashboard presented by the status module 310 may allow a user to create and manage a distribution list of clients 106 and the code segments that are partitioned and sent to the clients 106. For example, if clients 106 A-D require a service pack and clients 106 E-H require a security patch, the user may create a distribution list for clients 106 A-D and another list for clients 106 E-H. The user may then select the software to be partitioned and sent to each distribution list. Further, the user may also select the size of the portions of the partitioned software, the size of the email attachments sent to the clients 106, the time to begin sending the emails, and/or the like. The status module 310 may then monitor the progress of the software sent to the clients 106 on a per client basis.

In one embodiment, the status module 310 generates a consolidated status report associated with distributions of one or more code segments. In some embodiments, the consolidated status report includes a status of one or more code segment distributions. For example, the status report may include a list of clients 106, and the code segments distributed to each client 106, with a status of the distribution, such as "successful," "unsuccessful," "in progress," "paused," and/or the like. In some embodiments, the status module 310 includes a completion percentage for distributions that are in progress in the status report. In certain embodiments, the status module 310 includes an estimated completion time for each distribution in progress and also a completion time for each distribution that is completed in the status report. In another embodiment, the status module 310 includes notifications, messages, error codes, and/or the like in the status report for each distribution.

The status module 310, in some embodiments, provides the status report in a printable format, such as a word processing document, a PDF, and/or the like. In certain embodiments, the status module 310 presents information in the status report based on user input. For example, a user (e.g., an IT administrator) may customize the information on the status report, such as the organization of the data, the types of data to be included in the report, and/or the like. In another embodiment, the status module 310 automatically creates a status report based on a schedule determined by a user. For example, an IT administrator may have a status report created every morning at 9:00 AM, or the like. Alternatively, the status module 310 creates a status report in response to user input.

Figure 4:
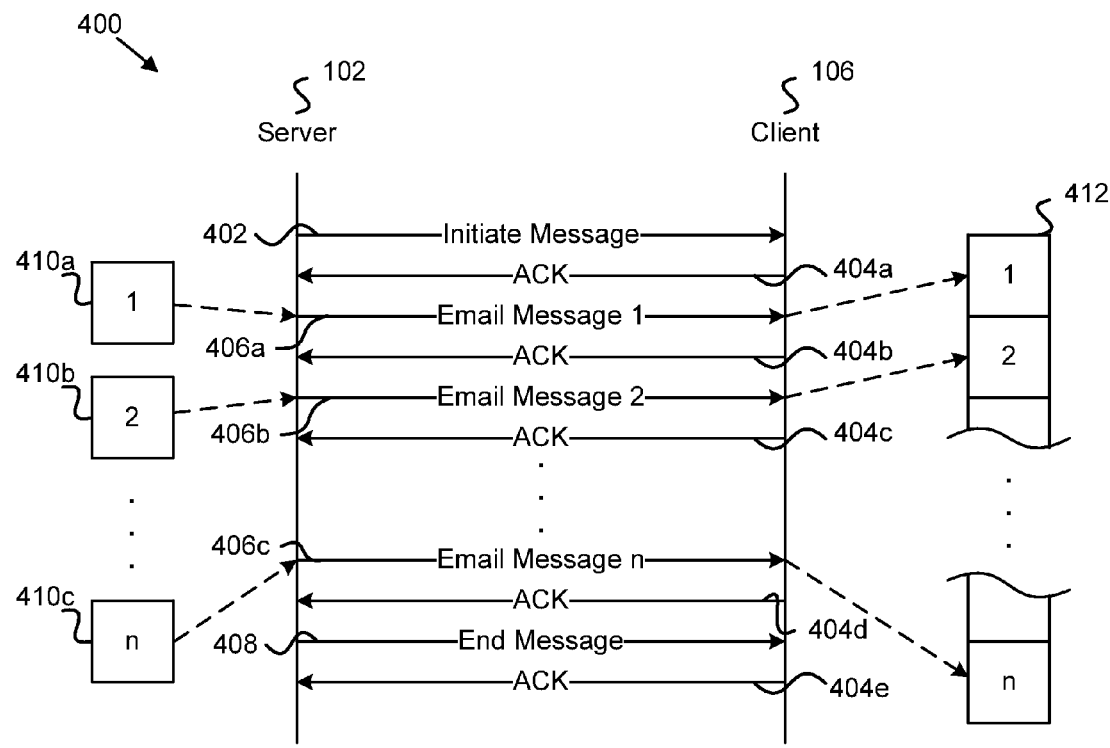
FIG. 4 is a schematic block diagram illustrating one embodiment of delivering software via email.

FIG. 4 depicts one embodiment of a system 400 for email-based software delivery. In one embodiment, the system 400 includes a plurality of portions 410a-c of a code segment. In some embodiments, the code segment includes a software update, a security update, a patch, a software application, and/or the like. In certain embodiments, a partition module 202 segments the code segment into the one or more portions 410a-c. In another embodiment, an email module 204 generates one or more email messages 406a-c and combines the one or more portions 410a-c of the code segment into the email messages.

In one embodiment, the server 102 initiates communication with the client 106 by sending an initiate email message 402, which notifies the client 106 to expect one or more email messages that include one or more portions of a code segment. The email module 204, in some embodiments, sends an acknowledgement ("ACK") email message 404a from the client 106 to the server 102 to acknowledge receipt of the initiate email message 402. In one embodiment, the communication module 206 sends the first email message 406a of the plurality of email messages 406a-c to the client 106. In response to receiving an ACK email message 404b in response to receiving the first email message 406a, the communication module 206 sends another email message 406b of the plurality of email message 406a-c. The client 106 acknowledges reception of the second email message 406b by sending an ACK email message 404c. The server 102 continues to send email messages 406a-c, which the client 106 acknowledges 404a-e until a final email message 408 is received.

In some embodiments, when the client 106 receives an email message 406a-c, the email module 204 removes the one or more portions of the code segment from the received email 406a-c. In some embodiments, the email module 204 stores the one or more portions until a final email message 408 is received and acknowledged 404e. A partition module 202, in some embodiments, reassembles the one or more received portions into the code segment 412, which may be executed on the client 106. In this manner, a client 106 may receive a software update, application, patch, or the like when the client 106 has intermittent network 104 connection to the server 102.

Figure 5:
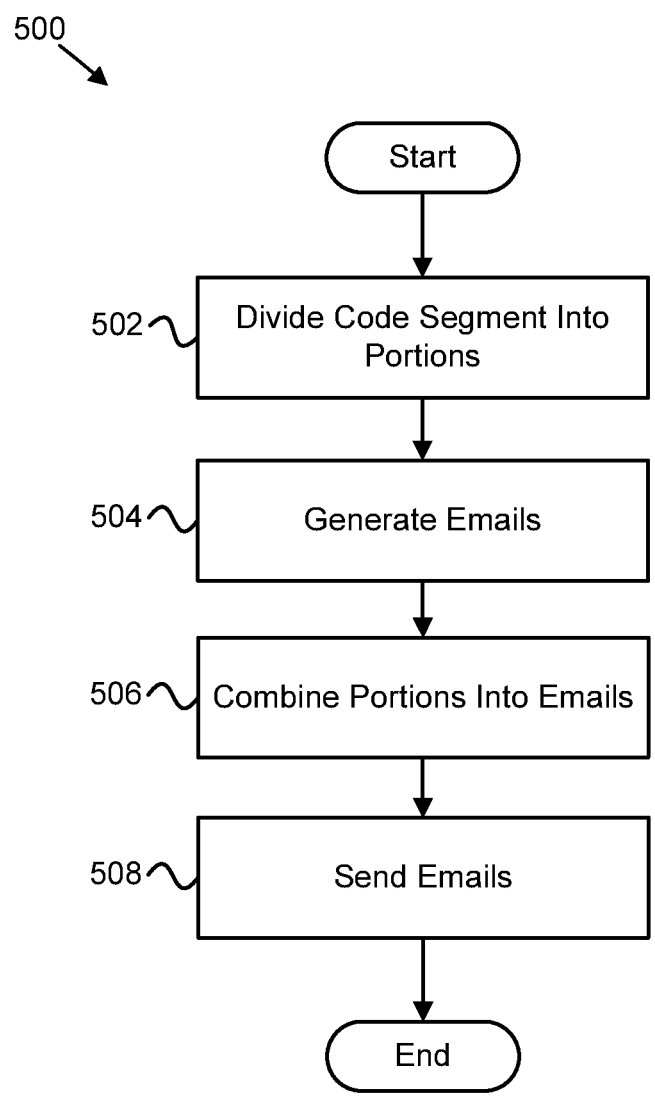
FIG. 5 is a schematic flow chart diagram illustrating one embodiment of a method for email-based software delivery.

FIG. 5 depicts a flow chart illustrating one embodiment of a method 500 for email-based software delivery. In one embodiment, the method 500 begins and a partition module 202 divides 502 a code segment into one or more portions that together form the code segment. In another embodiment, an email module 204 generates 504 a plurality of email messages and combines 506 the one or more portions of the code segment into each email message of the plurality of email messages. In a further embodiment, a communication module 206 sends 508 the plurality of email messages to a client 106, and the method 500 ends.

Figure 6:
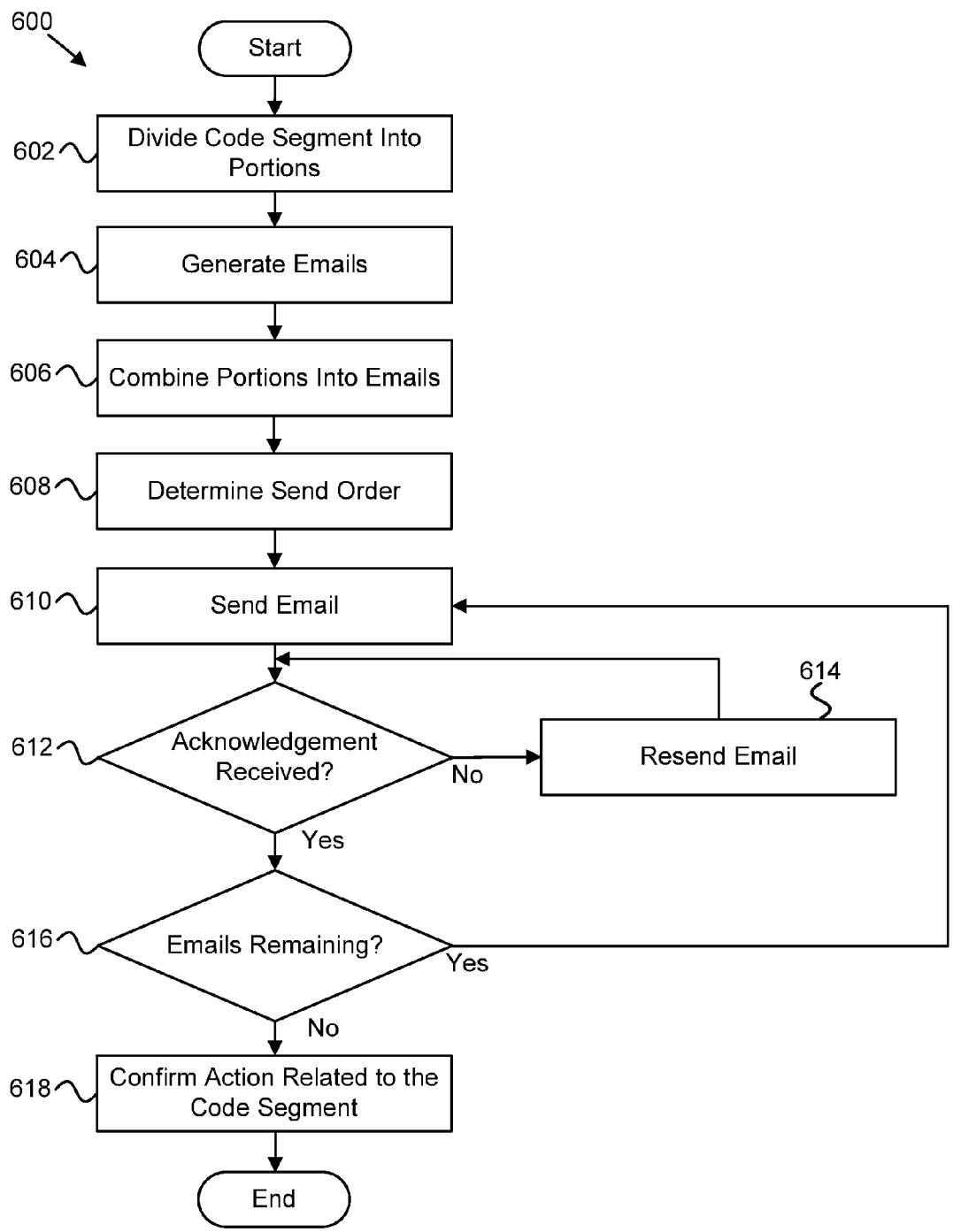
FIG. 6 is a schematic flow chart diagram illustrating one embodiment of another method for email-based software delivery.

FIG. 6 depicts a flow chart illustrating one embodiment of a method 600 for email-based software delivery. In one embodiment, the method 600 begins and a partition module 202 divides 602 a code segment into one or more portions that together form the code segment. In certain embodiments, the partition module 202 divides 602 the code segment into equal-sized portions, varying-sized portions, or user-defined portions.

In a further embodiment, an email module 204 generates 604 a plurality of email messages and combines 606 the one or more portions of the code segment into each email message of the plurality of email messages. In certain embodiments, the email module 204 attaches the each portion of the one or more portions to an email of the plurality of emails as an email attachment. In some embodiments, the email module 204 provides secondary data in an email message that describes one or more portions combined in the email message. The secondary data may include the size of a combined portion, the total size of the reassembled code segment, error-detection codes, and/or the like.

In one embodiment, a sequence module 304 determines 608 an order to send the plurality of email messages to the client 106. In some embodiments, the sequence module 304 arranges the email messages in random order. In another embodiment, the sequence module 304 arranges the email messages in a reassembly order, which may include the same order necessary to reassemble the code segment. In certain embodiments, the sequence module 304 arranges the email messages in order of attachment size. In another embodiment, the sequence module 304 determines 608 the order to send the plurality of email messages based on user input.

In another embodiment, a communication module 206 sends 610 the plurality of email messages to a client 106. In certain embodiments, after an email is sent, the communication module 206 determines 612 whether an acknowledgment email message has been received. If an acknowledgment email message has not been received, the communication module 206 may resend 614 the email message. In another embodiment, if an acknowledgment email message has been received, the communication module 206 determines 616 whether there are emails remaining to be sent. If there are emails remaining to be sent, in some embodiments, the communication module 206 sends 610 the next email message.

In one embodiment, if there are no more emails to be sent, an action module 302 confirms 618 an action related to the code segment. In certain embodiments, the action module 302 receives confirmation from the client 106 that all the portions have been received. In some embodiments, the action module 302 receives confirmation 618 that the integrity of the portions has been verified to ensure the portions have not been corrupted. In another embodiment, the action module 302 receives 618 confirmation that the portions have been reassembled into the code segment and/or executed on the client 106, and the method 600 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a server comprising a processor, wherein the server communicates with a client;
a partition module that divides, by the processor, a code segment into one or more portions that together form the code segment, each of the one or more portions of the code segment having a size specified by a user associated with the server;
an email module that generates a plurality of email messages and combines one or more portions of the code segment into each email message of the plurality of email messages; and
a communication module that sends the plurality of email messages to the client to be reassembled on the client, each of the plurality of email messages being sent in succession, wherein a subsequent email message is not sent until an acknowledgement email message is received from the client, the acknowledgement email message acknowledging successful receipt of a preceding email message,
wherein at least a portion of the said modules comprise one or more of a hardware circuit, a programmable hardware device, and code executable by a processor, the executable code stored on one or more non-transitory computer readable storage media.

2. The apparatus of claim 1, further comprising an action module that confirms an action related to the code segment, wherein the action is selected from the group consisting of a reassembly on the client and an execution on the client.

3. The apparatus of claim 1, wherein the email module combines one or more portions of the code segment into an email message by attaching the one or more portions to the email message.

4. The apparatus of claim 1, further comprising a sequence module that determines an order to send the plurality of email messages to the client.

5. The apparatus of claim 1, wherein an email message of the plurality of email messages comprises instructions for reassembling the one or more portions of the code segment.

6. The apparatus of claim 1, wherein the communication module pauses sending email messages of the plurality of email messages in response to communication with the client being interrupted, and wherein the communication module continues sending email messages of the plurality of email messages in response to communication with the client being restored.

7. The apparatus of claim 1, further comprising an integrity module that resends one or more email messages in response to receiving an integrity email from the client, the integrity email indicating that one or more portions of the code segment lacks integrity.

8. The apparatus of claim 1, further comprising a security module that encrypts each email message of the plurality of email messages.

9. The apparatus of claim 1, further comprising a status module that determines the status of one or more code segments sent to a client, the status of the one or more code segments being presented to a user.

10. The apparatus of claim 1, wherein the code segment comprises one of a software update, a patch, and a software application.

11. A method comprising:
dividing, by a processor, a code segment into one or more portions that together form the code segment, each of the one or more portions of the code segment having a size specified by user input;
generating a plurality of email messages and combining one or more portions of the code segment into each email message of the plurality of email messages, wherein at least one email message includes additional data associated with the code segment in a body of the at least one email message; and
sending the plurality of email messages to a client to be reassembled on the client, each of the plurality of email messages being sent in succession, wherein a subsequent email message is not sent until an acknowledgement email message is received from the client, the acknowledgement email message acknowledging successful receipt of a preceding email message.

12. The method of claim 11, further comprising confirming an action related to the code segment wherein the action is selected from the group consisting of a reassembly on the client and an execution on the client.

13. The method of claim 11, further comprising wherein combining one or more portions of the code segment into an email message comprises attaching the one or more portions to the email message.

14. The method of claim 11, further comprising determining an order to send the plurality of email messages to the client.

15. The method of claim 11, further comprising resending one or more email messages in response to receiving an integrity email from the client, the integrity email indicating that one or more portions of the code segment lacks integrity.

16. The method of claim 11, further comprising encrypting each email message of the plurality of email messages.

17. The method of claim 11, further comprising determining the status of one or more code segments sent to a client, the status of the one or more code segments being presented to a user.

18. A program product comprising a non-transitory computer readable storage medium that stores code executable by a processor to perform:
   dividing a code segment into one or more portions that together form the code segment, each of the one or more portions of the code segment having a size specified by user input;
   generating a plurality of email messages and combining one or more portions of the code segment into each email message of the plurality of email messages, wherein at least one email message includes additional data associated with the code segment in one or more email header fields, the additional data comprising one or more of, a size of a code portion attached to the at least one email message, a total size of the code segment, and one or more error codes; and
   sending the plurality of email messages to a client to be reassembled on the client, each of the plurality of email messages being sent in succession, wherein a subsequent email message is not sent until an acknowledgement email message is received from the client, the acknowledgement email message acknowledging successful receipt of a preceding email message.

\* \* \* \* \*